(12) United States Patent
Venkataraman et al.

(10) Patent No.: US 11,233,525 B2
(45) Date of Patent: *Jan. 25, 2022

(54) RECEIVER AND TIME-OF-FLIGHT SYSTEM WITH HIGH DYNAMIC RANGE HAVING A COUPLING CAPACITOR RESPECTIVELY CONNECTED TO A PHOTODIODE AND A SIGMA DELTA ANALOG TO DIGITAL CONVERTER

(71) Applicant: TEXAS INSTRUMENTS INCORPORATED, Dallas, TX (US)

(72) Inventors: Jagannathan Venkataraman, Bangalore (IN); Prabu Sankar Thirugnanam, Chennai (IN); Raja Reddy Patukuri, Nizamabad (IN); Sandeep Kesrimal Oswal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/748,849

(22) Filed: Jan. 22, 2020

(65) Prior Publication Data

US 2020/0162097 A1 May 21, 2020

Related U.S. Application Data

(63) Continuation of application No. 15/950,690, filed on Apr. 11, 2018, now Pat. No. 10,581,451, which is a (Continued)

(30) Foreign Application Priority Data

Mar. 11, 2014 (IN) ............................ 1245/CHE/2014

(51) Int. Cl.
*H03M 3/00* (2006.01)

(52) U.S. Cl.
CPC ............. *H03M 3/30* (2013.01); *H03M 3/494* (2013.01); *H03M 3/402* (2013.01); *H03M 3/43* (2013.01)

(58) Field of Classification Search
CPC .......... H03M 3/30; H03M 3/402; H03M 3/43; H03M 3/494
(Continued)

(56) References Cited

U.S. PATENT DOCUMENTS 4,857,928 A * 8/1989 Gailus .................. H04B 14/062
341/143
5,442,353 A 8/1995 Jackson
(Continued)

*Primary Examiner* — Que Tan Le
(74) *Attorney, Agent, or Firm* — Valerie M. Davis; Charles A. Brill; Frank D. Cimino

(57) ABSTRACT

The disclosure provides a receiver with high dynamic range. The receiver includes a photodiode that generates a current signal. A coupling capacitor is coupled to the photodiode, and generates a modulation signal in response to the current signal received from the photodiode. A sigma delta analog to digital converter (ADC) is coupled to the coupling capacitor, and generates a digital data in response to the modulation signal. A digital mixer is coupled to the sigma delta ADC, and generates an in-phase component and a quadrature component corresponding to the digital data. A processor is coupled to the digital mixer, and processes the in-phase component and the quadrature component corresponding to the digital data.

23 Claims, 4 Drawing Sheets

Related U.S. Application Data continuation of application No. 14/644,308, filed on Mar. 11, 2015, now abandoned.

(58) Field of Classification Search
USPC ............................................. 250/214 R, 221
See application file for complete search history.

(56) References Cited

U.S. PATENT DOCUMENTS

| | | |
|---|---|---|
| 8,390,715 B2 | 3/2013 | Matsunaga et al. |
| 2010/0271522 A1 | 10/2010 | Matsunaga et al. |
| 2012/0177386 A1 | 7/2012 | Zhou et al. |
| 2013/0242283 A1 | 9/2013 | Bailey et al. |

* cited by examiner

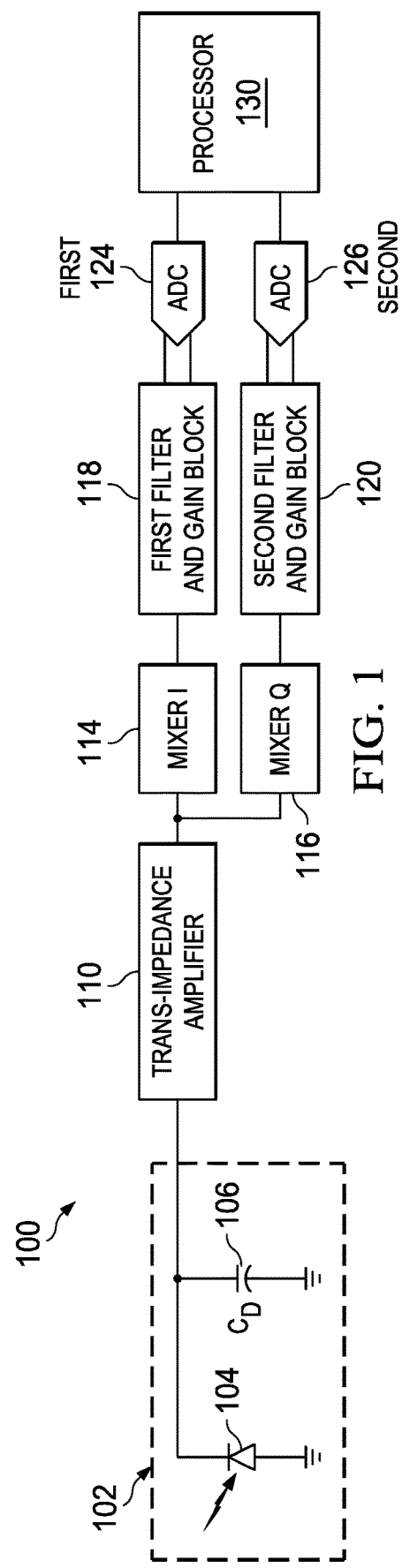
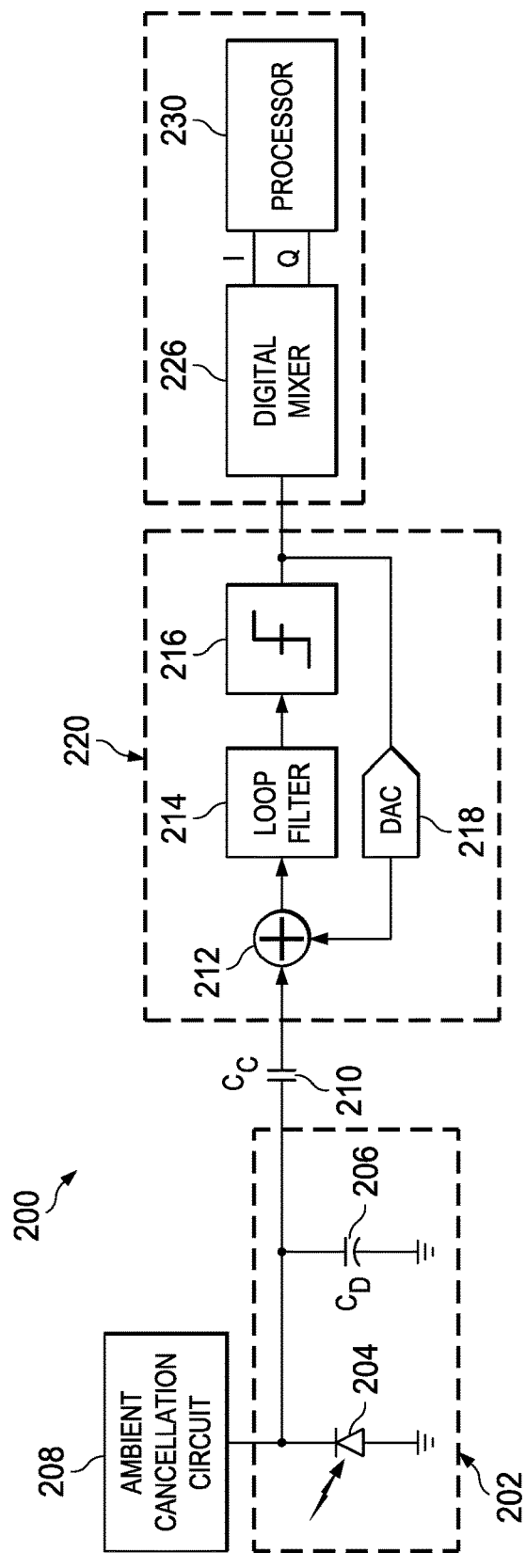
FIG. 1
FIG. 2

RECEIVER AND TIME-OF-FLIGHT SYSTEM WITH HIGH DYNAMIC RANGE HAVING A COUPLING CAPACITOR RESPECTIVELY CONNECTED TO A PHOTODIODE AND A SIGMA DELTA ANALOG TO DIGITAL CONVERTER

CROSS REFERENCE TO RELATED APPLICATIONS

This continuation application claims priority to U.S. patent application Ser. No. 15/950,690, filed Apr. 11, 2018, which claims priority to U.S. patent application Ser. No. 14/644,308, filed Mar. 11, 2015 (now abandoned), which claims priority to India provisional patent application No. 1245/CHE/2014, filed Mar. 11, 2014, all of which are hereby incorporated by reference in their entirety.

TECHNICAL FIELD

The present disclosure is generally related to time-of-flight (TOF) systems, and more particularly to achieving high dynamic range in a receiver associated with a TOF system.

BACKGROUND

An emerging category of electronic devices is time-of-flight (TOF) systems. The TOF systems find applications in accelerometers, monolithic gyroscopes, light sensors, conveyor belts, depth sensing, proximity sensing, gesture recognition and imagers. A TOF system includes a light source that emits light pulses. The light pulses are emitted towards a target, which reflects the light pulses. The target is any object of interest which may include, but not limited to, a human, an automated component, an animal, an electronic device etc. A TOF sensor in the TOF system receives the reflected light pulses. The TOF sensor receives the reflected light pulses after a time of flight, which is proportional to a distance of the target from the TOF system.

The TOF sensor includes one or more TOF sensor pixels. Each TOF sensor pixel includes a receiver. The receiver processes the reflected light pulses to estimate the distance of the target from the TOF system. In addition to the reflected light pulses, the receiver also receives other signals such as, but not limited to, electrical interferences, crosstalk signals and ambient light. The ambient light is due to one or more of the following, but not limited to, florescent lamps, sunlight, bulbs etc.

The ambient light causes a direct current (DC) signal being generated in the receiver. A high DC signal saturates the receiver. This causes an error in estimating the distance of the target from the TOF system. In one example, a signal strength of the reflected light pulse is 30 dB whereas an interference generated is of the order of 100 dB. Thus, a receiver with high dynamic range is required.

SUMMARY

According to an aspect of the disclosure, a receiver is disclosed. The receiver includes a photodiode that generates a current signal. A coupling capacitor is coupled to the photodiode, and generates a modulation signal in response to the current signal received from the photodiode. A sigma delta analog to digital converter (ADC) is coupled to the coupling capacitor, and generates a digital data in response to the modulation signal. A digital mixer is coupled to the sigma delta ADC, and generates an in-phase component and a quadrature component corresponding to the digital data. A processor is coupled to the digital mixer, and processes the in-phase component and the quadrature component corresponding to the digital data.

BRIEF DESCRIPTION OF THE VIEWS OF DRAWINGS

FIG. 1 illustrates a receiver;

FIG. 2 illustrates a receiver, according to an embodiment;

DETAILED DESCRIPTION OF THE EMBODIMENTS

Figure 3:
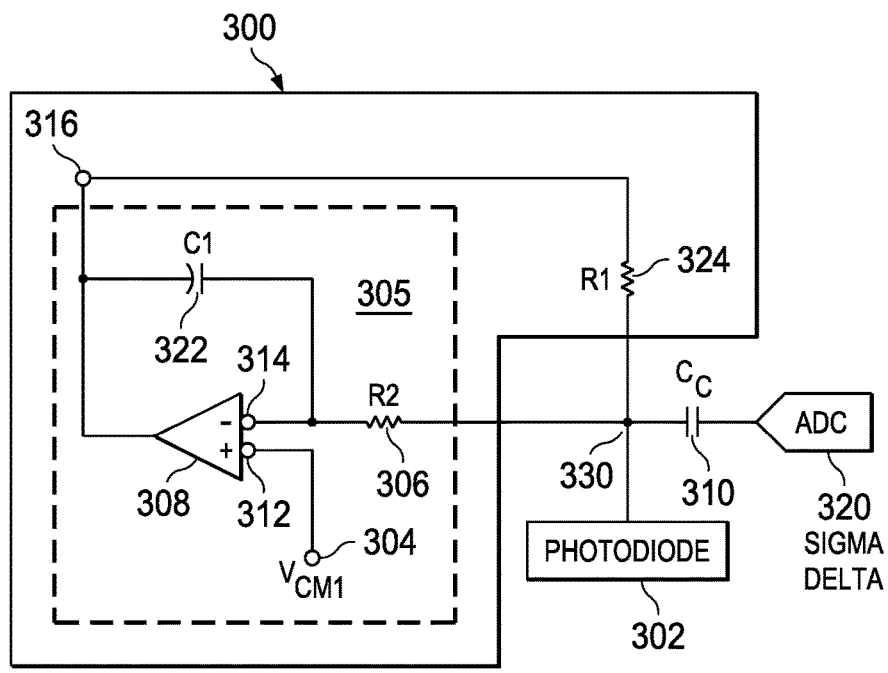
FIG. 3 illustrates an ambient cancellation circuit, according to an embodiment.

FIG. 1 illustrates a receiver 100. The receiver 100 includes a photodiode 102, a trans-impedance amplifier (TIA) 110, a mixer I 114, a mixer Q 116, a first filter and gain block 118, a second filter and gain block 120, a first analog to digital converter (ADC) 124, a second analog to digital converter (ADC) 126 and a processor 130.

The photodiode 102 includes a sensor 104 and an associated capacitance $C_D$ 106. The TIA 110 is coupled to the photodiode 102. The mixer I 114 and the mixer Q 116 are coupled to the TIA 110. The first filter and gain block 118 is coupled to the mixer I 114. The second filter and gain block 120 is coupled to the mixer Q 116.

The first ADC 124 is coupled to the first filter and gain block 118. The second ADC 126 is coupled to the second filter and gain block 120. The processor 130 is coupled to the first ADC 124 and the second ADC 126.

The operation of the receiver 100 illustrated in FIG. 1 is explained now. The receiver in one example is used in a time-of-flight (TOF) system. The TOF system includes a light source that emits light pulses. The light pulses are emitted towards a target, which reflects the light pulses. The receiver 100 in the TOF system receives the reflected light pulses. The receiver 100 receives the reflected light pulses after a time of flight, which is proportional to a distance of the target from the TOF system.

The sensor 104 in the photodiode 102 receives the reflected light pulses. The associated capacitance $C_D$ 106 stores a charge corresponding to the reflected light pulses. The charge represents a modulated signal received by the photodiode 102. The charge stored in the associated capacitance $C_D$ 106 is received by the TIA 110. The TIA 110 demodulates the modulated signal to generate an in-phase voltage and a quadrature voltage.

The in-phase voltage is receiver by the mixer I 114, and the quadrature voltage is received by the mixer Q 116. The mixer I 114 multiplies the in-phase voltage and a voltage corresponding to the light pulses generated by the TOF system, to generate an in-phase voltage component. The mixer Q 116 multiplies the quadrature voltage and the voltage corresponding to the light pulses generated by the TOF system, to generate a quadrature voltage component.

The in-phase voltage component is filtered and amplified in the first filter and gain block 118. The quadrature voltage component is filtered and amplified in the second filter and gain block 120. The first ADC 124 generates a first digital data corresponding to an output of the first filter and gain block 118. The second ADC 126 generates a second digital data corresponding to an output of the second filter and gain block 120.

The processor 130 processes the first digital data and the second digital data to estimate a distance of the target from the TOF system. The mixer I 114 and the mixer Q 116 provides an offset to the in-phase voltage component and quadrature phase component. This results in phase errors in the first digital data and the second digital data. In addition, the filter and gain block 118 and the filter and gain block 120, introduces gain error in the first digital data and the second digital data respectively.

The receiver 100 also receives ambient light. The ambient light is due to one or more of the following, but not limited to, florescent lamps, sunlight, bulbs etc. The ambient light causes a direct current (DC) being generated in the receiver 100. The receiver 100 processes this direct current through the mixer, filter and gain block and ADC. This current is cancelled in the processor 130. However, when ambient light conditions are above a threshold, it is required to cancel this direct current at the input.

This is because if the direct current is cancelled by the processor 130, a dynamic range of the receiver 100 gets limited as it gets saturated by the direct current. Thus, the receiver 100 does not provide a high dynamic range in a TOF system in the presence of ambient light. In one example, the direct current generated in the receiver 100 is 30 uA while an alternating current generated from the reflected light pulses is 100 pA. Thus, the receiver 100 is required to detect the 100 pA alternating current in presence of 30 uA direct current without reaching saturation.

FIG. 2 illustrates a receiver 200, according to an embodiment. The receiver 200 includes a photodiode 202, an ambient cancellation circuit 208, a coupling capacitor Cc 210, a sigma delta analog to digital converter (ADC) 220, a digital mixer 226 and a processor 230.

The photodiode 202 includes a sensor 204 and an associated capacitance $C_D$ 206. The ambient cancellation circuit 208 is coupled to the photodiode 202. The coupling capacitor Cc 210 is coupled to the photodiode 202. The sigma delta ADC 220 is coupled to the coupling capacitor Cc 210. The sigma delta ADC 220 includes a first summer 212, a loop filter 214, a quantizer 216 and a digital to analog converter (DAC) 218.

The first summer 212 is coupled to the coupling capacitor Cc 210. The loop filter 214 is coupled to the first summer 212. The quantizer 216 is coupled to the loop filter 214. The DAC 218 is coupled to the quantizer 216.

The digital mixer 226 is coupled to the quantizer 216 in the sigma delta ADC 220. The processor 230 is coupled to the digital mixer 226. The receiver 200 may include one or more additional components known to those skilled in the relevant art and are not discussed here for simplicity of the description.

The operation of the receiver 200 illustrated in FIG. 2 is explained now. The receiver 200 in one example is used in a time-of-flight (TOF) system. The TOF system includes a light source that emits light pulses. The light pulses are emitted towards a target, which reflects the light pulses. The receiver 200 in the TOF system receives the reflected light pulses. The receiver 200 receives the reflected light pulses after a time of flight, which is proportional to a distance of the target from the TOF system.

The sensor 204 in the photodiode 202 receives the reflected light pulses. The associated capacitance $C_D$ 206 stores a charge corresponding to the reflected light pulses. The photodiode 202 generates a current signal based on the reflected light pulses. The current signal includes a direct current (DC) signal. The DC signal is generated because of ambient light received by the photodiode 202 in the receiver 200. The ambient light is due to one or more of the following, but not limited to, florescent lamps, sunlight, bulbs etc.

The ambient cancellation circuit 208 cancels the DC signal in the current signal. A modulation signal is generated when the current signal is provided to the coupling capacitor Cc 210. The modulation signal is provided to the sigma delta ADC 220. The sigma delta ADC 220 generates a digital data in response to the modulation signal. In one example, the sigma delta ADC 220 is a band pass sigma delta ADC.

The first summer 212 in the sigma delta ADC 220 generates an error signal in response to the modulation signal and a feedback current signal. The loop filter 214 filters the error signal to generate a filtered signal. The quantizer 216 quantizes the filtered signal to generate the digital data. In one version, the quantizer 216 is a 1 bit quantizer. This eases the node scaling requirements for the receiver 200. Also, this creates a low power requirement for zero crossing detection in the quantizer 216. The DAC 218 receives the digital data as a feedback signal. The DAC 218 generates the feedback current signal. The first summer 212 receives the feedback current signal from the DAC 218. In one example, the first summer 212 subtracts the feedback current signal from the modulation signal to generate the error signal.

The digital mixer 226 receives the digital data from the sigma delta ADC 220. The digital mixer 226 generates an in-phase component (I) and a quadrature component (Q) corresponding to the digital data. The processor 230 processes the in-phase component and the quadrature component corresponding to the digital data. The processor 230 thereby estimates a distance of the target from the TOF system.

In receiver 200, the current signal is directly provided for processing and the processing in the sigma delta ADC 220 is performed on the modulation signal. Hence, a trans-impedance amplifier is not required as in the receiver 100. Also, the sigma delta ADC 220 generates the digital data; hence the mixing is performed digitally in the digital mixer 226. This avoids any phase or gain errors that are prevalent when mixing is performed in analog domain such as in the receiver 100.

The sigma delta ADC 220 is a current input band pass sigma delta ADC which makes it a power efficient ADC. In addition, the ambient cancellation circuit 208 is separated from a circuit in the receiver 200 which processes the modulation signal. The ambient cancellation circuit 208 is capable of cancelling the DC signal in the current signal.

As the DC signal is canceled at an input of the receiver 200 and is not processed with the modulation signal, it results in high dynamic range of the receiver 200. The ambient cancellation circuit 208 provides a good low frequency ambient rejection and it also supports in relaxing the noise constraints of the receiver 200.

FIG. 3 illustrates an ambient cancellation circuit 300, according to an embodiment. The ambient cancellation circuit 300 is analogous to the ambient cancellation circuit 208 (illustrated in FIG. 2) in connection and operation. The ambient cancellation circuit 300 is coupled to a photodiode 302. The photodiode 302 is similar in connection and operation to the photodiode 202.

The ambient cancellation circuit 300 is also coupled to a coupling capacitor Cc 310 which is further coupled to a sigma delta ADC 320. The coupling capacitor Cc 310 is analogous in connection and operation to the coupling capacitor Cc 210. The sigma delta ADC 320 is similar in connection and operation to the sigma delta ADC 220.

The ambient cancellation circuit 300 includes a feedback circuit 305 and a first resistor R1 324. The feedback circuit 305 is coupled to the photodiode 302, and the first resistor R1 324 is coupled between an output node 316 of the feedback circuit 305 and the photodiode 302.

The feedback circuit 305 includes a first operational amplifier 308. The first operational amplifier 308 receives a first common mode voltage $V_{CM1}$ 304 at a first input port 312. A second resistor R2 306 is coupled between the photodiode 302 and a second input port 314 of the first operational amplifier 308.

A first capacitor C1 322 is coupled between the second input port 314 of the first operational amplifier 308 and the output node 316 of the feedback circuit 305. The output node 316 of the feedback circuit 305 receives an output of the first operational amplifier 308. The ambient cancellation circuit 300 may include one or more additional components known to those skilled in the relevant art and are not discussed here for simplicity of the description.

The operation of the ambient cancellation circuit 300 illustrated in FIG. 3 is explained now. The photodiode 302 generates a current signal based on received light pulses. The current signal includes a direct current (DC) signal. The DC signal is generated because of ambient light received by the photodiode 302. The ambient light is due to one or more of the following, but not limited to, florescent lamps, sunlight, bulbs etc.

A voltage generated at the second input port 314 of the first operational amplifier 308 because of the DC signal is compared with the first common mode voltage $V_{CM1}$ 304. A current noise generated because of a voltage noise (Vnoise) of the first operational amplifier 308 is given by $$Inoise = Vnoise/[R_1*(1+[sC_1R_2]^{-1})\|R_2] \quad (1)$$

$$Inoise \approx Vnoise/(R_1\|R_2) \quad (2)$$

In receiver 100, the current noise generated is proportional to the associated capacitance $C_D$ 106. Thus, the effect of voltage noise in the first operational amplifier 308 is scaled with the R1//R2 resistor instead of the associated capacitance $C_D$ 106 in receiver 100. This helps in relaxing the power specification of the first operational amplifier 308. Also, appropriately choosing the first resistor R1 324 and the second resistor R2 306 would further reduce the noise generated by the first operational amplifier 308.

The first operational amplifier 308 is a low power and a low noise operational amplifier. As the DC signal is canceled at an input of a receiver (or a TOF receiver) and is not processed with the modulation signal, it results in high dynamic range of the receiver. The ambient cancellation circuit 300 provides a good low frequency ambient rejection and it also supports in relaxing the noise constraints of the receiver, for example receiver 200.

The ambient cancellation circuit 300 sets a bias of the photodiode 302 and cancels any out of band interferers. The ambient cancellation circuit 300 prevents saturation of the photodiode 302.

Figure 4:
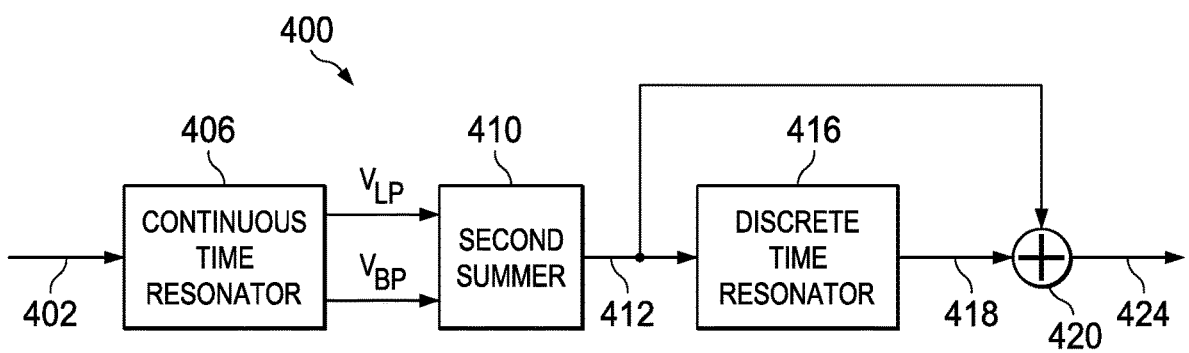
FIG. 4 illustrates a loop filter, according to an embodiment.

FIG. 4 illustrates a loop filter 400, according to an embodiment. The loop filter 400 is analogous to the loop filter 214 (illustrated in FIG. 2) in connection and operation. The loop filter 400 is explained in connection with the receiver 200 illustrated in FIG. 2. The loop filter 400 includes a continuous time resonator 406, a second summer 410, a discrete time resonator 416 and a third summer 420.

The continuous time resonator 406 receives an error signal 402 from a first summer similar to the first summer 212. The second summer 410 is coupled to the continuous time resonator 406. The discrete time resonator 416 is coupled to the second summer 410, and the third summer 420 is coupled to the discrete time resonator 416. The loop filter 400 may include one or more additional components known to those skilled in the relevant art and are not discussed here for simplicity of the description.

The operation of the loop filter 400 illustrated in FIG. 4 is explained now. The continuous time resonator 406 generates a low pass voltage $V_{LP}$ and a band pass voltage $V_{BP}$ in response to the error signal. The loop filter 400 utilizes anti-aliasing property of the continuous time resonator 406. The second summer 410 receives the low pass voltage $V_{LP}$ and the band pass voltage $V_{BP}$, and generates a summed voltage 412. In one example, the second summer 410 sums the low pass voltage $V_{LP}$ and the band pass voltage $V_{BP}$, to generate a summed voltage 412.

The discrete time resonator 416 generates a discrete voltage 418 in response to the summed voltage 412. In one implementation, a transfer function of the discrete time resonator 416 is given by following equation.

$$S = \frac{Z^{-2}}{1+Z^{-2}} \quad (3)$$

The discrete time resonator 416 provides band pass shaping to the summed voltage 412 to generate the discrete voltage 418. Also, the band pass shaping provided by the discrete time resonator 416 is independent of process variations. In the above implementation, a center frequency of the discrete time resonator 416 is selected at Fs/4 to ease the processing requirement, for example, in the receiver 200, where Fs is a sampling frequency.

The third summer 420 receives the summed voltage 412 and the discrete voltage 418, and generates a filtered output 424. In one version, the third summer 420 sums the summed voltage 412 and the discrete voltage 418 to generate the filtered output 424. The operation of each of the continuous time resonator 406 and the second summer 410 is further explained in detail in the subsequent paragraphs.

Figure 5:
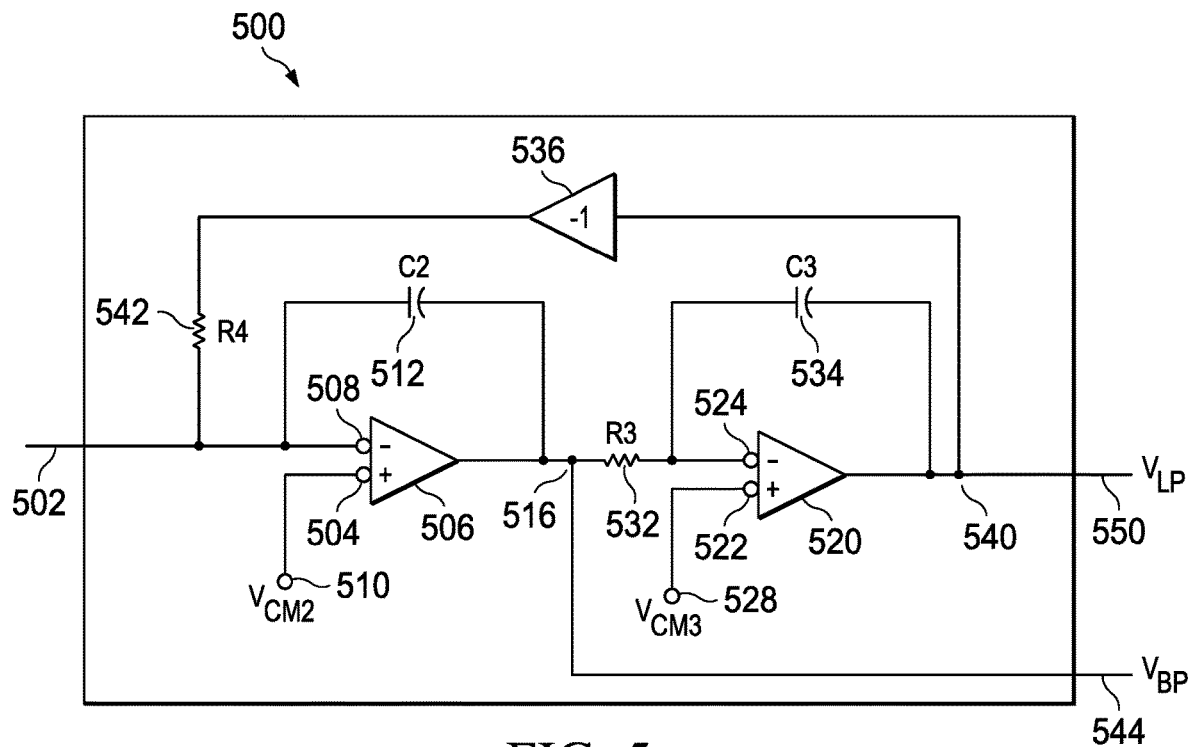
FIG. 5 illustrates a continuous time resonator, according to an embodiment.

FIG. 5 illustrates a continuous time resonator 500, according to an embodiment. The continuous time resonator 500 is analogous to the continuous time resonator 406 (illustrated in FIG. 4) in connection and operation. The continuous time resonator 406 includes a second operational amplifier 506 and a third operational amplifier 520. The second operational amplifier 506 receives a second common mode voltage $V_{CM2}$ at a first input port 504. A second input port 508 of the second operational amplifier 506 receives an error signal 502 (similar to the error signal 402).

A second capacitor C2 512 is coupled between the second input port 508 of the second operational amplifier 506 and a first output port 516 of the second operational amplifier 506. The third operational amplifier 520 receives a third common mode voltage $V_{CM3}$ 528 at a first input port 522. A third resistor R3 532 is coupled between the first output port 516 of the second operational amplifier 506 and a second input port 524 of the third operational amplifier 520.

A third capacitor C3 534 is coupled between the second input port 524 of the third operational amplifier 520 and a second output port 540 of the third operational amplifier 520. A fourth resistor R4 542 is coupled between the second input port 508 of the second operational amplifier 506 and the second output port 540 of the third operational amplifier 520.

In one example, the continuous time resonator 500 includes a negative feedback amplifier 536 coupled between the fourth resistor R4 542 and the second output port 540 of the third operational amplifier 520. The continuous time resonator 500 may include one or more additional components known to those skilled in the relevant art and are not discussed here for simplicity of the description.

The operation of the continuous time resonator 500 illustrated in FIG. 5 is explained now. The second operational amplifier 506 integrates the error signal 502 to generate a band pass voltage $V_{BP}$ 544. The band pass voltage $V_{BP}$ 544 is generated at the first output port 516 of the second operational amplifier 506. The third operational amplifier 520 receives the band pass voltage $V_{BP}$ 544. The third operational amplifier 520 integrates the band pass voltage $V_{BP}$ 544 to generate a low pass voltage $V_{LP}$ 550.

A noise contribution from the continuous time resonator 500 is highly dependent on the fourth resistor R4 542, the third resistor R3 532 and the second capacitor C2 512. An input current noise has contributions from the second operational amplifier 506, the fourth resistor R4 542 and the third resistor R3 532.

A contribution of noise from the fourth resistor R4 542 is inversely proportional to a square root of the fourth resistor R4 542. Thus, a higher value of the fourth resistor R4 542 results in a lower noise. A contribution of noise from the third resistor R3 532 is directly proportional to a product of the second capacitor C2 512 and a square root of the third resistor R3 532. Thus, a lower value of the second capacitor C2 512 and the third resistor R3 532 results in a lower noise.

A corner frequency of the continuous time resonator 500 is defined as $$\text{Corner Frequency} = \frac{1}{\sqrt{R4 \times R3 \times C2 \times C3}} \quad (4)$$

To combat the direct current (DC) signal because of ambient light, the fourth resistor R4 542 is scaled in accordance with a voltage swing constraints of the second operational amplifier 506 and the third operational amplifier 520. A large DC signal would require a lower fourth resistor R4 542 which increases the noise contribution as discussed above.

A lower fourth resistor R4 542 is compensated by increasing the third resistor R3 532, the second capacitor C2 512 and the third capacitor C3 534, to maintain the corner frequency desired from the continuous time resonator 500. Increasing the third resistor R3 532, the second capacitor C2 512 and the third capacitor C3 534 would increase the noise. Since, the ambient cancellation circuit 208 is separated in the receiver 200; it removes the constraints of lower fourth resistor R4 542. Each of the fourth resistor R4 542, the third resistor R3 532, the second capacitor C2 512 and the third capacitor C3 534 is optimized to achieve best noise performance from the continuous time resonator 500.

Figure 6:
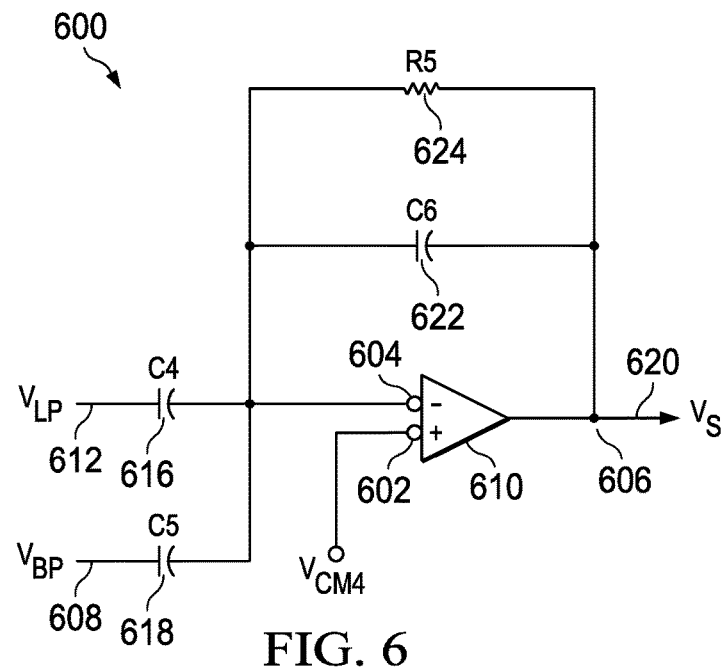
FIG. 6 illustrates a summer, according to an embodiment.

FIG. 6 illustrates a summer 600, according to an embodiment. The summer 600 is analogous to the second summer 410 (illustrated in FIG. 4) in connection and operation. The summer 600 is explained in connection with the loop filter 400 and the continuous time resonator 500. The summer 600 includes a fourth operational amplifier 610. The fourth operational amplifier 610 receives a fourth common mode voltage $V_{CM4}$ at a first input port 602. The fourth operational amplifier 610 generates a summed voltage Vs 620 at a third output port 606.

A fourth capacitor C4 616 is coupled between a second input port 604 of the fourth operational amplifier 610 and the second output port 540 of the third operational amplifier 520. The fourth capacitor C4 616 receives a low pass voltage $V_{LP}$ 612 from the continuous time resonator 500. A fifth capacitor C5 618 is coupled between the first input port 602 of the fourth operational amplifier 610 and the first output port 516 of the second operational amplifier 506.

The fifth capacitor C5 618 receives a band pass voltage $V_{BP}$ 618 from the continuous time resonator 500. A sixth capacitor C6 622 and a fifth resistor R5 624 are coupled between the second input port 604 of the fourth operational amplifier 610 and the third output port 606 of the fourth operational amplifier 610.

The band pass voltage $V_{BP}$ 618 and the low pass voltage $V_{LP}$ 612 are required to summed and gained with different coefficients. A large gain is required to be provided because of node scaling. Typically, the gains used for the band pass voltage $V_{BP}$ 618 and the low pass voltage $V_{LP}$ 612 are high to detect a low modulation signal received from the photodiode, for example photodiode 202.

The high gain means that an offset of the second operational amplifier 506 and the third operational amplifier 520 (in the continuous time resonator 500) are also gained to a high value. This can saturate later stages of the receiver 200. In the summer 600, the band pass voltage $V_{BP}$ 618 and the low pass voltage $V_{LP}$ 612 are provided high gain without increasing the offsets of the second operational amplifier 506 and the third operational amplifier 520 in the continuous time resonator 500.

The summer 600 is a capacitive summer. The summer 600 cancels any offsets provided by the second operational amplifier 506 and the third operational amplifier 520. The summer 600 sums the band pass voltage $V_{BP}$ 618 and the low pass voltage $V_{LP}$ 612 to generate the summed voltage Vs 620. The summer 600 improves a dynamic range of a receiver for example the receiver 200.

Figure 7:
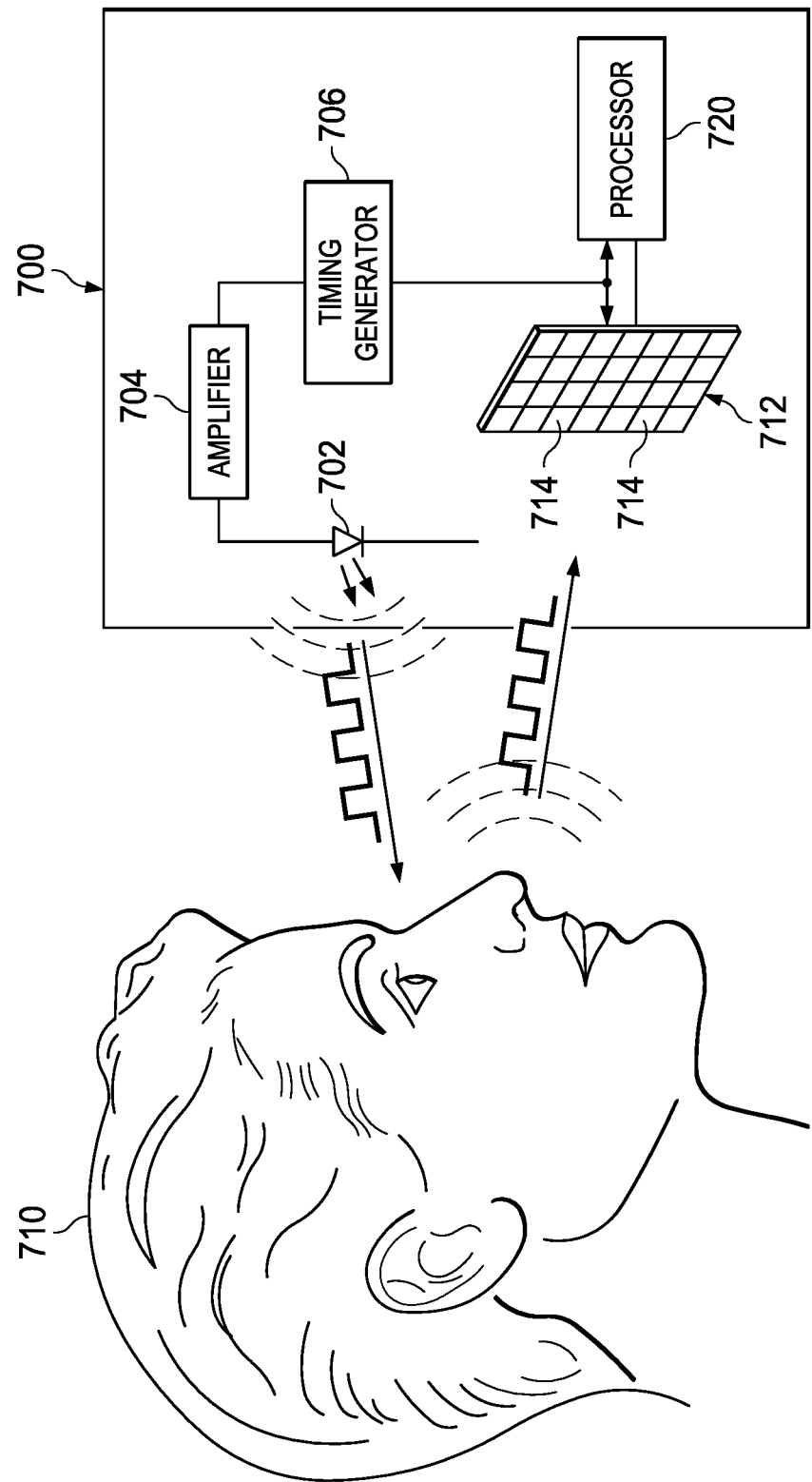
FIG. 7 illustrates a time-of-flight (TOF) system, according to an embodiment.

FIG. 7 illustrates a time-of-flight (TOF) system 700, according to an embodiment. The TOF system 700 includes a light source 702, an amplifier 704 and a timing generator 706. The amplifier 704 is coupled to the timing generator 706, and the light source 702 is coupled to the amplifier 704. In one example, the light source 702 is an infrared (IR) light emitting diode (LED) that transmits IR light.

The TOF system 700 also includes a TOF sensor 712. The TOF sensor 712 includes one or more TOF sensor pixels illustrated as 714. Each TOF sensor pixel of the one or more TOF sensor pixels includes a receiver. The receiver is analogous to the receiver 200 in connection and operation.

In one example, the TOF sensor 712 is coupled to a processor 720, and each receiver in the TOF sensor 712 is coupled to the processor 720. In another example, each receiver of the one or more receivers in a TOF sensor is associated with a processor (similar to receiver 200) and together these processors form processor 720.

In yet another example, one or more processors are coupled to the TOF sensor 712. The processor 720 can be, for example, a CISC-type (Complex Instruction Set Computer) CPU, RISC-type CPU (Reduced Instruction Set Computer), or a digital signal processor (DSP).

The timing generator 706 generates a clock frequency. The light source 702 emits light pulses at the clock frequency. The light pulses emitted by the light source 702 are reflected from a target 710 to generate reflected light pulses. A photodiode associated with a receiver in the TOF sensor 712 receives the reflected light pulses.

The receiver processes the reflected light pulses similar to the processing performed in the receiver 200 illustrated in FIG. 2. The processor 720 process an in-phase component and a quadrature component received from a digital mixer associated with each receiver, to estimate a distance of the target 710 from the TOF system 700.

A trans-impedance amplifier (TIA) is not required as in the receiver 100. The requirement of building an accurate voltage at high modulating frequency using TIA is eliminated in the TOF system 700. This helps in eliminating high power TIA and associated phase shift variation caused by TIA. The mixing is performed digitally in the digital mixer associated with each receiver.

This avoids any phase or gain errors that are prevalent when mixing is performed in analog domain such as in the receiver 100. The sigma delta ADC used in the receiver is a current input band pass sigma delta ADC which makes it a power efficient ADC. In addition, the DC signal is canceled at an input of the receiver which results in high dynamic range of the receiver.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A receiver comprising:
a sigma delta analog to digital converter (ADC) having an ADC input and an ADC output;
a coupling capacitor having first and second capacitor terminals, the first capacitor terminal connected to the photodiode, and the second capacitor terminal connected to the ADC input;
a digital mixer having a mixer input and a mixer output, the mixer input coupled to the ADC input; and
a processor having a processor input coupled to the mixer output.

2. The receiver of claim 1, further comprising an ambient cancellation circuit including:
a feedback circuit having a feedback output; and
a first resistor coupled between the feedback output and the first terminal.

3. The receiver of claim 2, wherein the feedback circuit includes:
an operational amplifier having an amplifier input and an amplifier output, wherein the amplifier output is coupled to the first resistor;
a second resistor coupled between the first capacitor terminal and the amplifier input; and
a capacitor coupled between the amplifier input and the amplifier output.

4. The receiver of claim 1, wherein the sigma delta ADC includes:

a first summer having first and second summer inputs and a summer output, the first summer input coupled to the second capacitor terminal;
a loop filter having a filter input and a filter output, the filter input coupled to the summer output;
a quantizer having a quantizer input and a quantizer output, the quantizer input coupled to the filter output, and the quantizer output coupled to the mixer input; and
a digital to analog converter (DAC) coupled between the quantizer output and the second summer input.

5. The receiver of claim 4, wherein the loop filter includes:
a continuous time resonator coupled to the first summer;
a second summer coupled to the continuous time resonator;
a discrete time resonator coupled to the second summer, the discrete time resonator having an input and an output; and
a third summer coupled to the input and the output of the discrete time resonator.

6. The receiver of claim 5, wherein the continuous time resonator includes:
a first operational amplifier having an input and an output;
a first capacitor coupled between the input and the output of the first operational amplifier;
a second operational amplifier having an input and an output;
a second capacitor coupled between the input and the output of the second operational amplifier;
a first resistor coupled between the output of the first operational amplifier and the input of the second operational amplifier; and
a second resistor coupled between the input of the first operational amplifier and the output of the second operational amplifier.

7. The receiver of claim 6, wherein the second summer includes:
a third operational amplifier having an input and an output;
a third capacitor coupled between the output of the second operational amplifier and the input of the third operational amplifier;
a fourth capacitor coupled between the output of the first operational amplifier and the input of the third operational amplifier
a fifth capacitor coupled between the input and the output of the third operational amplifier and
a third resistor coupled between the input and the output of the third operational amplifier.

8. The receiver of claim 1, wherein the sigma delta ADC is a band pass sigma delta ADC.

9. A method comprising:
canceling an ambient light interferer signal from a current signal, the current signal generated from reflected light pulses;
generating, by a coupling capacitor, a modulation signal from the current signal;
generating, by a sigma delta analog to digital converter (ADC) connected to the coupling capacitor, digital data in response to the modulation signal;
generating an in-phase component and a quadrature component corresponding to the digital data; and
processing the in-phase component and the quadrature component corresponding to the digital data.

10. The method of claim 9, wherein generating the digital data in response to the modulation signal includes:

summing the modulation signal and a feedback current signal to generate an error signal;
filtering the error signal to generate a filtered signal;
quantizing the filtered signal to generate the digital data; and
generating the feedback current signal using the digital data.

11. The method of claim 9, wherein filtering the error signal includes:
integrating the error signal to generate a band pass voltage;
integrating the band pass voltage to generate a low pass voltage;
summing the band pass voltage and the low pass voltage to generate a summed voltage;
generating a discrete voltage in response to the summed voltage; and
summing the discrete voltage and the summed voltage to generate the filtered signal.

12. A time-of-flight (TOF) system comprising:
a light source;
a TOF sensor including a sensor pixel, wherein the sensor pixel includes a receiver comprising:
a photodiode;
an ambient cancellation circuit having an ambient cancellation circuit output;
a sigma delta analog to digital converter (ADC) having an ADC input and an ADC output;
a coupling capacitor having first and second capacitor terminals, the first capacitor terminal connected to the photodiode and the ambient cancellation circuit output, and the second capacitor terminal connected to the ADC input; and
a digital mixer having a mixer input and a mixer output, the mixer input coupled to the ADC output; and
a processor having a processor input and a processor output, the processor input coupled to the mixer output, and the processor output coupled to the light source.

13. The TOF system of claim 12, wherein the ambient cancellation circuit includes:
a feedback circuit having a feedback output; and
a first resistor coupled between the feedback output and the first capacitor terminal.

14. The TOF system of claim 13, wherein the feedback circuit includes:
an operational amplifier having an amplifier input and an amplifier output, wherein the amplifier output is coupled to the first resistor;
a second resistor coupled between the first capacitor terminal and the amplifier input; and
a capacitor coupled between the amplifier input and the amplifier output.

15. The TOF system of claim 12, wherein the sigma delta ADC comprises:
a first summer having first and second summer inputs and a summer output, the first summer input coupled to the second capacitor terminal;
a loop filter having a filter input and a filter output, the filter input coupled to the summer output;
a quantizer having a quantizer input and a quantizer output, the quantizer input coupled between the filter output, and the quantizer output coupled to the mixer input; and
a digital to analog converter (DAC) coupled between the quantizer output and the second summer input.

16. The TOF system of claim 15, wherein the loop filter includes:

a continuous time resonator coupled to the first summer;
a second summer coupled to the continuous time resonator;
a discrete time resonator coupled to the second summer, the discrete time resonator having an input and an output; and
a third summer coupled to the input and the output of the discrete time resonator.

17. The TOF system of claim 16, wherein the continuous time resonator includes:
a first operational amplifier having an input and an output;
a first capacitor coupled between the input and the output of the first operational amplifier;
a second operational amplifier having an input and an output;
a second capacitor coupled between the input and the output of the second operational amplifier;
a first resistor coupled between the output of the first operational amplifier and the input of the second operational amplifier; and
a second resistor coupled between the input of the first operational amplifier and the output of the second operational amplifier.

18. The TOF system of claim 17, wherein the second summer includes:
a third operational amplifier having an input and an output;
a third capacitor coupled between the output of the second operational amplifier and the input of the third operational amplifier;
a fourth capacitor coupled between the output of the first operational amplifier and the input of the third operational amplifier
a fifth capacitor coupled between the input and the output of the third operational amplifier and
a third resistor coupled between the input and the output of the third operational amplifier.

19. A receiver comprising:
an ambient cancellation circuit having an ambient cancellation circuit output;
a sigma delta analog to digital converter (ADC) having an ADC input and an ADC output;
a coupling capacitor having first and second capacitor terminals, the first capacitor terminal coupled to the ambient cancellation circuit output, and the second capacitor terminal coupled to the ADC input;
a digital mixer having a mixer input and a mixer output, the mixer input coupled to the ADC output; and
a processor having a processor input coupled to the mixer output.

20. The receiver of claim 19, wherein the ambient cancellation circuit includes:
a feedback circuit having a feedback output; and
a first resistor coupled between the feedback output and the first capacitor terminal.

21. The receiver of claim 20, wherein the feedback circuit includes:
an operational amplifier having an amplifier input and an amplifier output, wherein the amplifier output is coupled to the first resistor;
a second resistor coupled between the first capacitor terminal and the amplifier input; and
a capacitor coupled between the amplifier input and the amplifier output.

22. The receiver of claim 19, wherein the sigma delta ADC includes:

a first summer having first and second summer inputs and a summer output, the first summer input coupled to the second capacitor terminal;

a loop filter having a filter input and a filter output, the filter input coupled to the summer output;

a quantizer having a quantizer input and a quantizer output, the quantizer input coupled to the filter output, and the quantizer output coupled to the mixer input; and a digital to analog converter (DAC) coupled between the quantizer output and the second summer input.

23. A receiver comprising:

a coupling capacitor having first and second capacitor terminals;

an ambient cancellation circuit including:
   a first resistor having first and second resistor terminals, the first resistor terminal coupled to the first capacitor terminal; and
   a feedback circuit including:
      an operational amplifier having an amplifier input and an amplifier output, the amplifier output coupled to the second resistor terminal;
      a second resistor having third and fourth resistor terminals, the third resistor terminal coupled to the first capacitor terminal, and the fourth resistor terminal coupled to the amplifier input; and
      a capacitor coupled between the amplifier input and the amplifier output;

a sigma delta analog to digital converter including:
   a summer having first and second summer inputs and a summer output, the first summer input coupled to the second capacitor terminal;
   a loop filter having a filter input and a filter output, the filter input coupled to the summer output;
   a quantizer having a quantizer input and a quantizer output, the quantizer input coupled to the filter output; and
   a digital to analog converter coupled between the quantizer output and the second summer input;

a digital mixer having a mixer input and a mixer output, the mixer input coupled to the quantizer output; and a processor having a processor input coupled to the mixer output.

* * * * *